United States Patent [19]

Bench

[11] 4,000,489
[45] Dec. 28, 1976

[54] DUAL-MODE WAVEFORM GENERATOR

[75] Inventor: Stephen Michael Bench, Lake Zurich, Ill.

[73] Assignee: B-Cubed Engineering, Inc., Elgin, Ill.

[22] Filed: June 6, 1975

[21] Appl. No.: 584,391

[52] U.S. Cl. .................. 340/384 E; 340/323 R; 331/78; 307/261; 84/1.01
[51] Int. Cl.² .................................. G08B 3/00
[58] Field of Search .......... 340/384 R, 384 E, 323; 307/227, 261; 328/36, 14, 186; 331/78; 84/1.01

[56] References Cited
UNITED STATES PATENTS

| | | | |
|---|---|---|---|
| 2,683,219 | 7/1954 | Mohr | 328/186 X |
| 2,871,378 | 1/1959 | Lohman | 307/227 X |
| 2,918,574 | 12/1959 | Gimpel et al. | 328/186 |
| 3,838,418 | 9/1974 | Brown | 340/384 E |

*Primary Examiner*—John W. Caldwell
*Assistant Examiner*—William M. Wannisky

[57] ABSTRACT

The disclosed circuit provides a signal generator which is particularly adapted for use as an audible "kilosonic" game device in which a plurality of switches are provided so that the different combinations of switch positions produce a corresponding number of different sounds. The circuit includes a voltage-controlled-oscillator (VCO) having an output coupled to a transducer such as a speaker. The VCO is modulated in accordance with a control signal, provided by an up-down staircase generator which is responsive to a pulse generator, to vary the frequency of its output signal. The output of the pulse generator is also selectively coupled with the output of the staircase generator. Time-constant circuits in each of the generators are respectively under the control of selected ones of the switches; and two basic modes of operation are provided by the selected switches so that the control signal at the VCO input is either a pseudo random signal, or a synchronized sub-multiple signal wherein the frequency of the staircase generator output signal is a sub-multiple of the pulse generator output signal. Accordingly, the number of different output sounds provided by the disclosed circuit is geometrically proportional to the number of switches provided.

12 Claims, 9 Drawing Figures

FIG. 1

DUAL-MODE WAVEFORM GENERATOR

BACKGROUND OF THE INVENTION

This invention relates to waveform generators and, more particularly, to an adaptive, dual-mode waveform generator which selectively produces a plurality of different waveforms.

Waveform generators are known in the art and are used to provide signal sources in various applications. For example, in the testing of a transmission path such as a telephone line or a radio channel, these generators are used to perform testing of response, stability and other parameters. A versatile generator is one which provides a variety of signals such as both a synchronized and a pseudo random signal. A synchronized signal is desirable in that it provides a recurrent, predictable waveform which accommodates various types of steady-state testing; and a pseudo random signal facilitates impulse response testing for characteristics such as "ringing". Although many prior art generators are versatile and adaptive, they are also unnecessarily sophisticated, expensive and complex. Further, these prior art generators in order utilize separate generators to achieve both synchronized and pseudo random signal sources. In the present invention, however, a relatively inexpensive and simple waveform generator is provided and, moreover, a substantial number of different waveforms are readily provided.

In one embodiment of the present invention, the waveform generator provides an electronic doorbell circuit having an output sound which is both distinctive and audibly pleasant. In this embodiment the waveform generator is arranged and adapted to provide a pseudo random output signal thereby to avoid acoustic nodes or nulls between conflicting signals in spatially separated multiple output device installations.

In another embodiment of the present invention, which I have chosen to be described in particular detail hereinafter, the waveform generator provides a "kilosonic" game which provides literally thousands of sounds both familiar and unique. It is noted that since the game device, as hereinafter described, includes a multitude of manual switches which provide a different output sound for essentially each different combination of switch positions, it not only provides a fascinating game, but it also can be used in the treatment of both mentally and physically retarded people in order to achieve physical dexterity and to learn sound association. It has also been found that the use of the game device, at one's leisure, often induces relaxation and reduces tension.

SUMMARY OF THE INVENTION

Briefly, a unique waveform generator, which can be a dual-mode waveform generator, is provided. The dual-mode waveform generator includes a pulse generator for providing a first signal and an up-down staircase generator means is responsive to the first signal for providing a second signal related to the first signal. Means are provided for controlling the relative frequency difference between the first and second signals from a first value to a second value wherein the second output signal is synchronized with the frequency of the first signal when the difference is the first value, and wherein the second signal varies randomly with respect to the frequency of the first signal when the difference is the second value. Output means are provided for deriving an output signal from the waveform generator.

BRIEF DESCRIPTION OF THE DRAWING

The advantages of this invention will become more readily appreciated as the same becomes completely understood by reference to the following detailed description when taken in conjunction with the accompanying drawing wherein.

DETAILED DESCRIPTION

Figure 1:
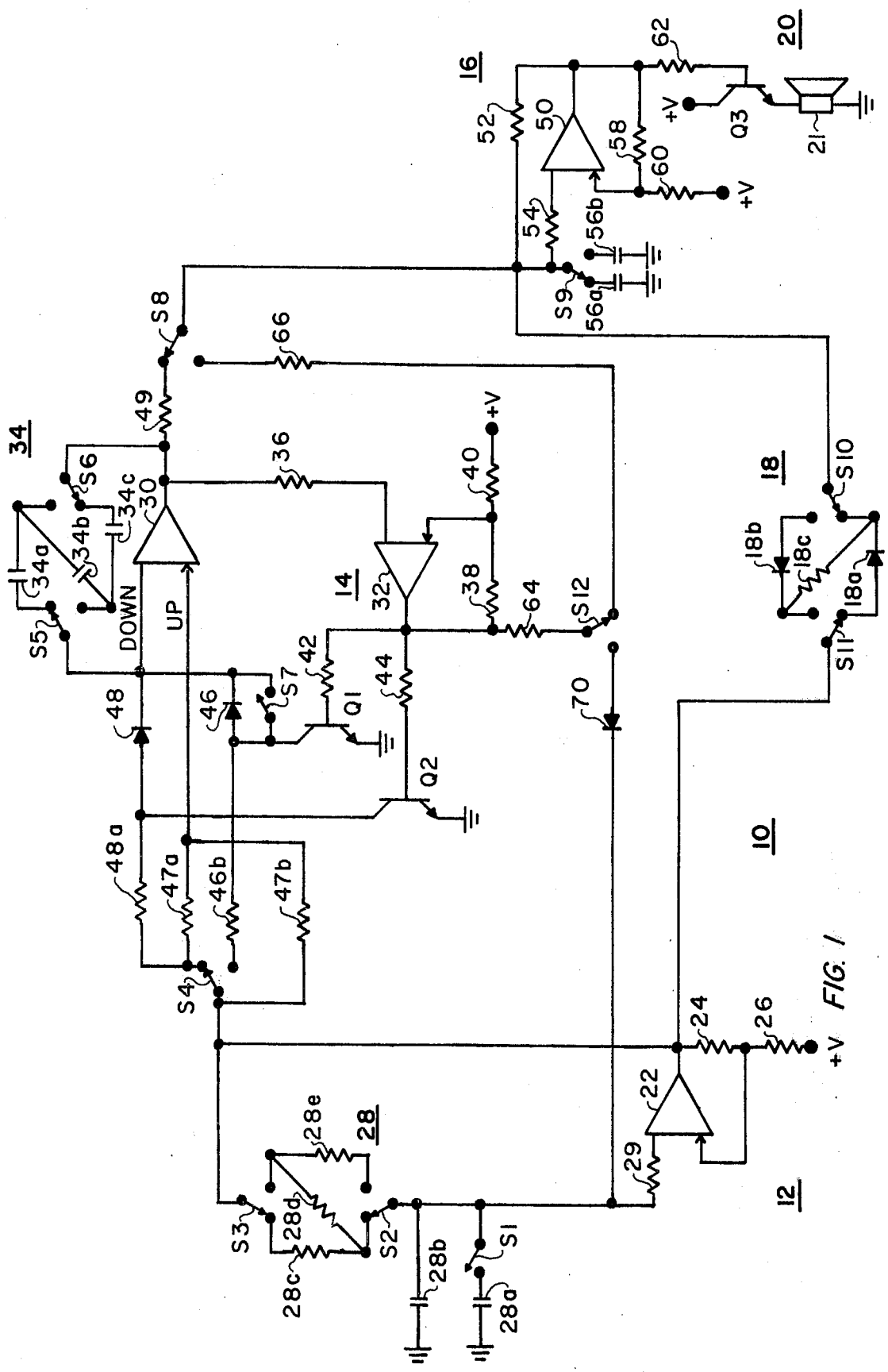
FIG. 1 is a combined block and schematic diagram of a preferred embodiment of a waveform generator in accordance with the present invention.

Referring now to FIG. 1, there is shown generally at 10 a dual-mode waveform generator in accordance with the principles of the present invention. In general, the waveform generator 10 includes a pulse generator shown generally at 12; an up-down staircase generator shown generally at 14; a signal-controlled-oscillator or voltage-controlled-oscillator (VCO) shown generally at 16; and, an electroacoustic output transducer circuit shown generally at 20. As will be discussed in detail hereinafter, the output of generator 14 is selectively coupled to VCO 16; and the output of generator 12 is also selectively coupled to the VCO 16 by way of a synchronization circuit shown generally at 18.

Pulse generator 12 includes an operational amplifier 22 having an output coupled to synchronization circuit 18 and to a fixed point of reference potential such as +V by way of resistors 24 and 26. The junction of resistors 24 and 26 is coupled to a first input of amplifier 22. The output of amplifier 22 is also coupled to its second input by way of a time-constant circuit 28 and a resistor 29. Circuit 28 includes two charging capacitors 28a and 28b which are coupled between the other input of amplifier 22 and a fixed point of reference potential such as ground. Capacitor 28a is selectively coupled into circuit 28 by way of a switch S1. These capacitors are coupled to resistors 28c, 28d and 28e by way of a switch S2. Circuit 28 is coupled to the output of amplifier 22 by way of a switch S3; and the output of pulse generator 12 at the junction of the output of amplifier 22 and switch S3 is coupled to the up-down staircase generator 14.

Staircase generator 14 includes an operational amplifier 30 arranged as an integrator and an operational amplifier 32 arranged as a Schmitt-Trigger circuit. The output of amplifier 30 is coupled to one of its inputs by way of a time-constant circuit 34 and switches S5 and S6. Switches S5 and S6 select one or more of capacitors 34a–c in the time-constant circuit 34. The input of amplifier 30 is coupled to a first output of amplifier 32 by way of a resistor 36. The output of amplifier 32 is coupled to its other input by way of a resistor 38 and this other input of amplifier 32 is also coupled to +V by way of a resistor 40. The output of amplifier 32 is coupled to the control electrodes of clamping transistors Q1 and Q2 respectively by way of resistors 42 and 44. The main electrodes of clamping transistors Q1 and Q2 are coupled between ground and the "DOWN" input of amplifier 30 by way of diodes 46 and 48 respectively.

A switch S7 is coupled across diode 46. The output of pulse generator 12 is coupled to both the "UP" and "DOWN" inputs of amplifier 30 by way of switch S4 which selects either resistors 47a and 48a, or resistors 46b and 47b. The output of amplifier 30 is also coupled to VCO 16 by way of an output resistor 49 and a switch S8.

VCO 16 includes an operational amplifier 50 having its output coupled to a first one of its inputs by way of a resistor 52 and a resistor 54 in a time-constant circuit. The time-constant circuit includes capacitors 56a and 56b which are selected by a switch S9. The output of amplifier 50 is also coupled to its other input by way of a resistor 58 and this other input is also coupled to +V by way of a resistor 60. Amplifier 50 and its associated circuitry are arranged as a Schmitt-Trigger, a stable oscillator whose output frequency varies in accordance with the level of a signal applied to its first input. The output of amplifier 50 is also coupled to transducer circuit 20 by way of a resistor 62. Transducer circuit 20 includes a transistor Q3 having its control electrode coupled to resistor 62 and its main electrodes coupled between +V and a first terminal of an electroacoustic transducer or speaker 21. The other terminal of speaker 21 is coupled to ground.

The output of pulse generator 12 is also coupled to the first input of VCO 16 by way of synchronization circuit 18. Synchronization circuit 18 includes diodes 18a and 18b and a resistor 18c which are selectively and operatively coupled into circuit 18 by way of switches S10 and S11.

The output of the Schmitt-Trigger amplifier 32 of staircase generator 14 is also coupled to the first input of VCO 16 by way of a resistor 64, a switch S12, a resistor 66 and switch S8. Switch S12 also couples the output of amplifier 32 to the input of amplifier 22 of generator 12 by way of a diode 70.

The individual operational amplifiers, their associated circuitry and the various elements illustrated in the drawing are by themselves, that is, as individual building blocks, generally well-known. For a more detailed description of the various elements of the device illustrated in the drawing figures, reference may be had to the National Semiconductor Corporation, 1973 publication or handbook entitled "Linear Applications". For example, the basic configuration of an up-down staircase generator, such as the basic configuration of generator 14 illustrated in the present drawing, is described in detail at page AN72–24 of the handbook. Similarly, a pulse generator similar to the basic elements of pulse generator 12 is described at page AN7-2–20; and a Schmitt-Trigger oscillator of the type used in VCO 16 is described at page AN72–19 of the handbook. In one constructed embodiment of the present invention, as illustrated in the present drawing, the operational amplifiers were National LM3900 integrated circuit types. Accordingly, the details of these individual circuit components and elements need not be described in great detail herein.

In general, however, pulse generator 12 provides a series of pulses having a pulse repetition frequency determined by the time-constant provided by circuit 28. Staircase generator 14 can be realized by supplying the pulses of generator 12 to an integrator circuit. However, in a preferred embodiment of the present invention, generator 14 provides a generally triangular but stepped output waveform which steps "up" and "down" in accordance with the repetition rate of the pulses provided by generator 12; and the time-constant circuit 34, in conjunction with resistors 46b, 47a, 47b and 48a, generally acts to control the height or amplitude of each step in the generally triangular shaped waveform. However, it will be noted that when the operating frequency of generator 14 is substantially greater than the operating frequency of generator 12, the output waveform of generator 14 increases and decreases between first and second levels, during the "high" or logic "1" portions of the output waveform provided by generator 12, in a generally triangular pattern without manifesting steps between the first and second levels. Further, when the operating frequency of generator 14 is substantially greater than the operating frequency of generator 12 and/or not geometrically related thereto, the output waveform of generator 14 will be a pseudo random varying signal — as discussed more fully hereinafter.

VCO 16 is essentially an astable oscillator having a base frequency output signal which is varied in accordance with the level of a signal applied to its first input which input is in the time-constant or feedback circuit of operational amplifier 50.

The operation of the waveform generator 10, in accordance with the present invention, is described as follows, and reference may be had to the waveforms illustrated in FIGS. 2a–2g as the description proceeds. Switches S1, S2 and S3 function to select various RC combinations in the time-constant circuit of pulse generator 12. Accordingly, each different switch position provides a different pulse repetition rate at the output of generator 12 as applied to switch S4 of generator 14. Thus, each different repetition rate provides either a faster or a slower stepping of the staircase generator 14.

Switches S4, S5 and S6 similarly vary the RC combinations of the time-constant circuit of staircase generator 14 to provide larger or smaller steps. Switch S7 functions to shunt or "short-out" the "DOWN" input of staircase generator 14 irrespective of the position of switch S4. Accordingly, the selected switch position provides either an up only operation or an up-down output waveform from generator 14.

Switch S8 selects either the up-down staircase waveform output of generator 14; or, the Schmitt-Trigger output portion of generator 14 by way of resistor 68, switch S12 and resistor 64. Accordingly, the Schmitt-Trigger portion of generator 14 is also used as a waveform source to directly control the output of VCO 16.

Figure 2:
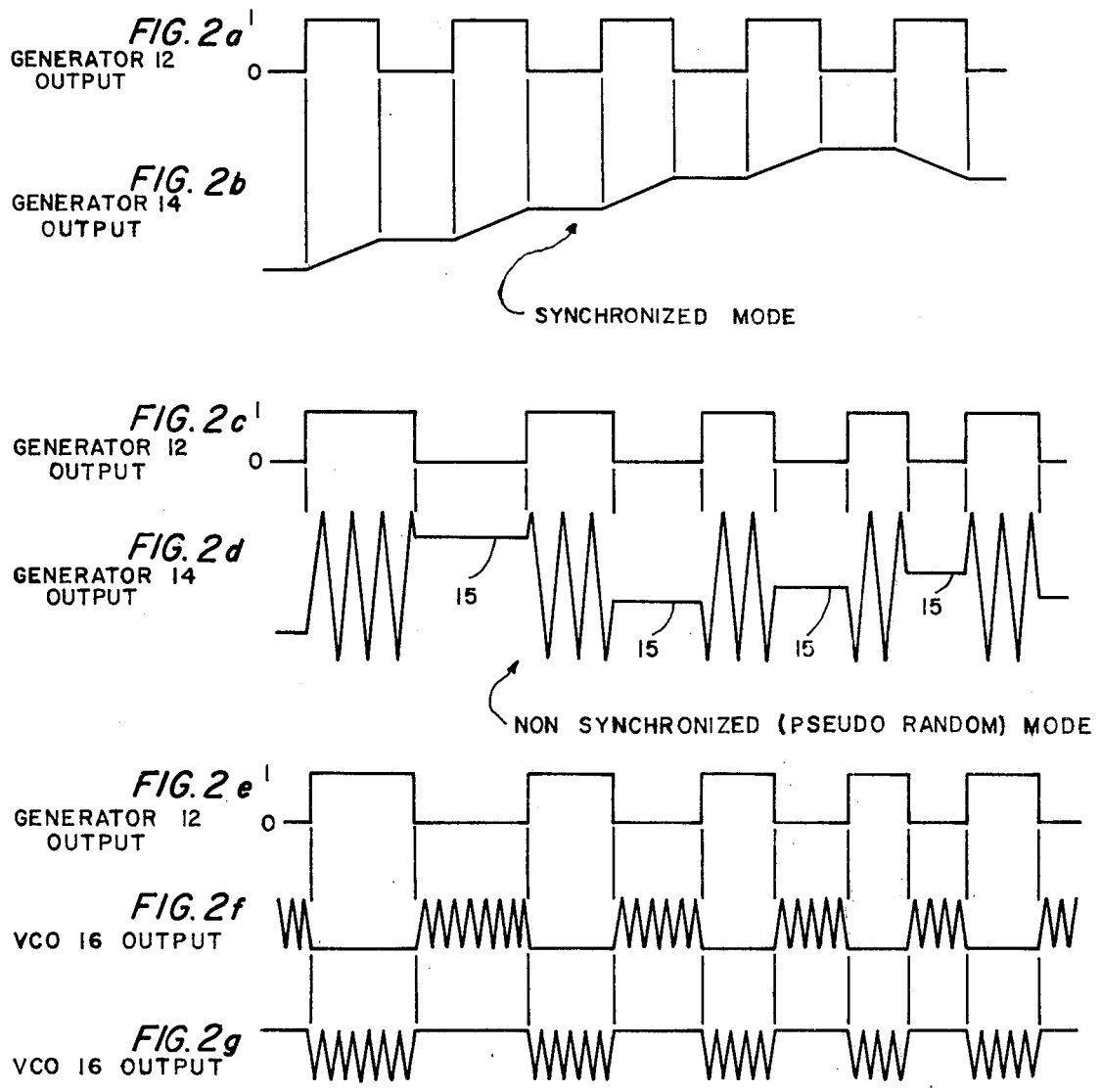
FIGS. 2a–2g illustrate exemplary waveforms useful in explaining the operation of the disclosed embodiment of the present invention; and, FIG. 3 is an alternative embodiment of the present invention in a form adapted for use as an electronic doorbell.

Switch S9 selects one of two different time-constants in the feedback circuit of amplifier 50. Accordingly, each switch position of switch S9 provides a different base frequency output signal of VCO 16. For example, in one constructed embodiment switch S9 selected one of two capacitors to provide either a 500 or a 1,000 cycle base frequency. As discussed more fully hereinafter, the various components associated with time-constant circuit 28 of generator 12 and time-constant circuit 34 of generator 14 are selected to provide at least one combination which results in a synchronized multiple or sub-multiple output signal from generator 14 as illustrated in FIGS. 2a and 2b. Further, at least one other combination results in a pseudo random output signal from generator 14.

Switches S10 and S11 in synchronization circuit 18 function to provide a second type of synchronization with respect to the staircase generator output and the output of pulse generator 12 as illustrated in FIGS.

2e–2g. That is, since the up-down staircase waveform of generator 14 is related to the waveform of the pulse generator 12 output, the output of generator 12 is advantageously utilized to alter the output waveform of generator 14 at the input of VCO 16 in a synchronous manner. When switches S10 and S11 are in the position shown in FIG. 1, a "high" or logic "1" output from generator 12 provides a logic "1" input signal to VCO 16 by way of diode 18a. When switches S10 and S11 are in their alternate positions, a "low" or logic "0" at the output of generator 12 provides a logic "0" to the input of VCO 16 by way of diode 18b.

It will not be appreciated that the output waveform of generator 12 provides the logic "1" and "0" outputs which are applied to the input of VCO 16 by way of diode 18a or 18b. It should also be appreciated that when either a logic "1" or "0" is applied to the input of VCO 16, the output of VCO 16 is "stopped" or inhibited as these signals exceed the "hysteresis" range of the Schmitt-Trigger incorporated therein. Thus, since the stepping of the staircase waveform of generator 14 is also controlled by the output pulses of generator 12, diodes 18a or 18b (as selected by switches S10 and S11) function to inhibit the output of waveform of generator 10 when the staircase waveform is either stepping (18a) or not stepping (18b). The effect of diode 18a is illustrated in FIG. 2f; and diode 18b in FIG. 2g. When switches S10 and S11 are respectively in a third position, diodes 18a and 18b are in a back-to-back, reversed or "bucking" configuration and, accordingly, synchronization circuit 18 is therefore essentially "open" or inoperative. Further, when switches S10 and S11 are in the fourth possible configuration, the output of generator 12 is coupled to the input of VCO 16 by way of resistor 18c. In this mode, the output signal of VCO 16 is provided with a superimposed additional frequency component which varies in accordance with the output signal of generator 12.

Finally, when switch S12 is coupled to the anode of diode 70, diode 70 is effectively in the feedback path of amplifier 22. That is, the output of amplifier 22 is coupled to its input by way of the equivalent impedance of a portion of generator 14 and diode 70. Thus, when the output of Schmitt-Trigger 32 is at a relatively high level with respect to ground, a relatively low impedance path is provided between the input and output of amplifier 22. This has the effect of changing the operating duty cycle of amplifier 22 and, therefore, the duty cycle of the output pulses of generator 12. The use of a diode feedback technique for varying the duty cycle of a pulse generator is generally set forth at page AN72–20 of the above-identified handbook.

As previously discussed, the values of the time-constant circuit components of generators 12 and 14 are provided so that there exists at least one combination of components wherein the frequency of operation of generator 14 is at or near a multiple or sub-multiple of the frequency of operation of generator 12. When this condition occurs, the frequency of operation of generator 14 "locks-in", or is forced to be synchronized, with the frequency of operation of generator 12 and, accordingly, the output staircase waveform is a synchronized multiple or sub-multiple of the output waveform of pulse generator 22 — as illustrated in FIGS. 2a and 2b. On the other hand, when the frequency of operation of generator 14 is substantially greater than the frequency of operation of generator 12, or when the respective frequencies are not near a multiple or sub-multiple of one another, the staircase waveform output signal of generator 14 will be a varying pseudo random signal as the respective periods of operation are not sufficiently geometrically related. This is illustrated in FIGS. 2c and 2d. It can be seen by reference to FIG. 2d that the output waveform of generator 14 varies randomly particularly at the portions thereof designated as 15.

It should now be appreciated that the plurality of switches provides a number of different time-constants in each of the generator circuits. Further, other switches such as the switches of synchronization circuit 18 provide additional different output waveforms. In one constructed embodiment of the present invention as illustrated in FIG. 1, it has been observationally estimated that approximately three-thousand discernably different waveforms and, therefore, sounds are provided. In the constructed embodiment the twelve switches were disposed in an unmarked fashion on a suitable housing, enclosure or box, and an output speaker, such as speaker 21, was provided on a suitable surface thereof. This particular application is used as a "kilo-sonic" game as described hereinbefore. In the game device configuration of the present invention, the switches are preferably unmarked or unidentified in order to add a dimension of unpredictability to the device. Accordingly, one generally must apply a degree of concentration to the game in order to predictably provide a given sound such as, for example, to match the sound of another participating device in a game of "tag". Of course one can use the game merely for pleasure thereby to produce various sounds at random. It has been found that not only are unique sounds provided but other more familiar sounds such as a telephone busy signal, a siren, a canary chirp, Morse code, "computer" sounds, a dog bark and a submarine-dive siren can be simulated.

It will be appreciated by those skilled in the art, however, that a similar configuration, in accordance with the present invention, can be used to provide a multi-purpose waveform generator wherein the individual switches are clearly marked so as to identify their function and thereby to provide a predictable, predetermined output signal which may be either a synchronized signal or a pseudo random signal. It will now be appreciated that the present invention provides a versatile, relatively simple and inexpensive dual-mode waveform generator having the capability of providing a number of different waveforms to suit a particular application, and which can be provided from an essentially single generator source.

Figure 3:
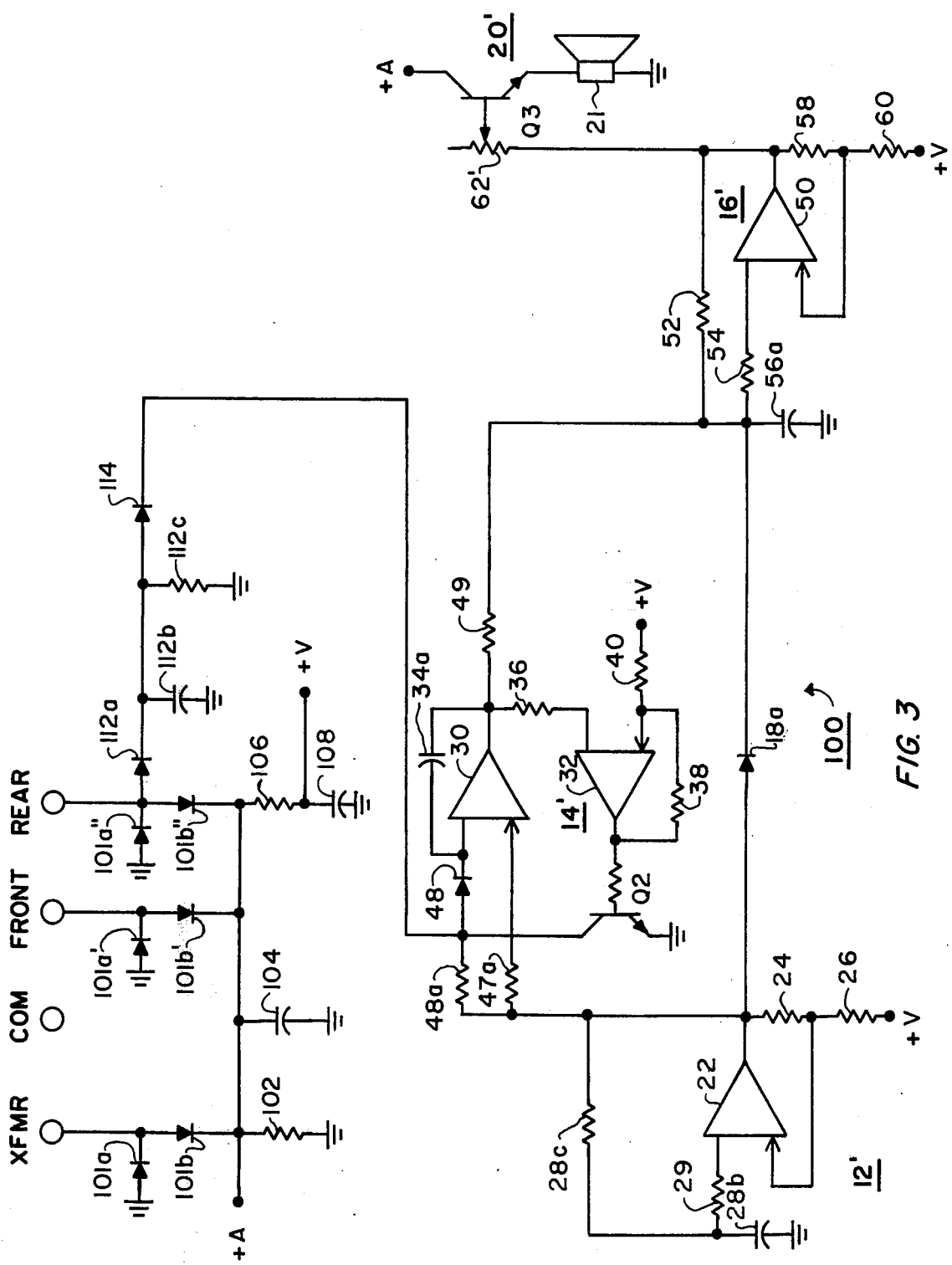

Referring now to FIG. 3, there is shown generally at 100 an alternative embodiment of the present invention in a form suitable for use as an electronic doorbell. The circuit of FIG. 3 is similar to the circuit of FIG. 1 and, accordingly, like elements bear like reference numerals. The time-constant circuits of generator 12' and 14' are selected so that the staircase output waveform of generator 14' is a pseudo random signal as previously described. This mode of operation is advantageously selected in order to accommodate those installations where multiple output transducers, such as multiple speakers which individually take the form of speaker 21, are utilized. Accordingly, the objectional acoustic nodes and nulls whih would otherwise result between the two or more output transducers are avoided as the output signal, although common to all output transducers, continuously varies in a random manner. Diode 18a is provided to inhibit the output of oscillator 16' when the staircase waveform is stepping up or down. Accordingly, the harsh FM effects that would otherwise be heard in the output signal are avoided.

The doorbell circuit 100 of FIG. 3 is adapted to receive the secondary of a low-voltage transformer at the terminals marked "XFMR." and "COM." The terminals illustrated as "FRONT" and "REAR" are adapted to interface with front and rear push buttons respectively coupled between the FRONT and REAR terminals and the COM. terminal. Thus, a closure provided by either push button couples the transformer secondary into the power source circuitry of doorbell circuit 100. Diodes 101a and 101b in conjunction with either diodes 101a' and 101b', or diodes 101a'' and 101b'' function to provide a full wave rectified power source. The full-wave rectified voltage is filtered by a resistor 102 and a capacitor 104 to provide a +A power source for transistor Q3 of output circuit 20'. A resistor 106 and a capacitor 108 provide a filtered and regulated source of fixed reference potential +V.

A diode 112a, a capacitor 112b and a resistor 112c function to provide a rectified D.C. signal when the rear door push button is depressed or activated to provide a closure. This additional signal is coupled through isolation diode 114 to clamp or disable the "down" input of generator 14'. Accordingly, when the rear doorbell button is activated to provide a closure, the audio output signal of doorbell circuit 100 is discernably and clearly different than the signal provided when the front doorbell button is activated. In either case, the output sound is both distinctive and audibly pleasant.

What has been taught, then, is a waveform generator facilitating, notably, a dual-mode multi-purpose waveform generator. It will be appreciated that the unique combination of elements, in accordance with the present invention, provides a multitude of waveforms not otherwise obtainable from the individual elements. It will also be appreciated, however, that the present invention can be utilized to provide other useful apparatus such as: an electronic musical instrument; an electronic doorbell circuit as illustrated above; a pseudo random code generator having predetermined frequency characteristics; and, an electronic kilo-sonic game device. Thus, it will be appreciated that the forms of the invention illustrated and described herein are but preferred embodiments of these teachings. They are shown as illustrations of the inventive concepts, however, rather than by way of limitation, and it is pointed out that various modifications and alterations may be indulged in within the scope of the appended claims.

What is claimed is:

1. A dual-mode waveform generator comprising, in combination:
   a pulse generator for providing a first signal;
   a staircase generator coupled to said pulse generator and responsive to said first signal for providing a second signal in response to said first signal;
   at least one of said generators having means for varying the operating frequency of its generator;
   means coupled to said means for varying the operating frequency for controlling the relative frequency difference between said first and second signals from a first value to a second value wherein said second signal is synchronized with the frequency of said first signal when said difference is said first value, and wherein said second signal varies randomly with respect to the frequency of said first signal when said difference is said second value; and,
   output means coupled to said staircase generator for deriving an output signal from said waveform generator.

2. The waveform generator according to claim 1, including means coupled to said first and second signals for providing a third signal which is selectively responsive to one or both of said first and second signals and for applying said third signal to said output means.

3. The waveform generator according to claim 2, wherein said output means includes a signal-controlled-oscillator coupled to said means coupled to said first and second signals for providing an output signal having an output frequency which varies in accordance with the amplitude of said third signal.

4. The waveform generator according to claim 2, wherein said means coupled to said first and second signals includes means responsive to said first signal for controlling predetermined portions of said output signal during corresponding portions of said first signal.

5. The waveform generator according to claim 4, wherein said means for controlling predetermined portions of said output signal includes at least one diode having first and second main electrodes respectively coupled to and between said pulse generator and said output means to inhibit said output signal when said first signal renders said diode conductive.

6. The waveform generator according to claim 2, wherein said pulse generator and said staircase generator each include a plurality of individually selectable time-constant circuits respectively operatively coupled to said generators to provide a corresponding number of different operating frequencies.

7. The waveform generator according to claim 2, wherein said second signal normally increases and decreases alternately between first and second levels in response to said first signal, and said staircase generator including means coupled to said staircase generator for selectively electronically inhibiting said second signal when said second signal is varying from a selected one to the other of said levels.

8. An electronic doorbell circuit comprising, in combination:
   a pulse generator for producing a series of pulses;
   a staircase generator coupled to said pulse generator and responsive to said pulses for producing a staircase signal which increases and decreases in response to said pulses and at a rate determined by a time-constant circuit of said staircase generator wherein said staircase signal varies randomly with respect to the frequency of said pulses;
   a voltage-controlled-oscillator receptive of said staircase signal for providing an output signal having a frequency which varies in accordance with the amplitude of said staircase signal;
   means responsive to said pulses and coupled to said oscillator for inhibiting said output signal when said staircase signal is increasing or decreasing whereby said frequency of said output signal varies in discrete steps; and,
   means for coupling said output signal to an electroacoustic transducer.

9. The doorbell circuit according to claim 8, including means for coupling said circuit between a transformer secondary and a contact closure device thereby to apply a source of operating potential to said circuit when a closure is provided by said device.

10. A multi-sound electronic game device for providing a plurality of different output sounds in accordance with selected switch positions, said device comprising, in combination:

a pulse generator for providing a first output signal having a pulse repetition frequency determined by a time-constant circuit of said pulse generator;

a staircase generator coupled to said pulse generator and responsive to said first output signal for providing a second output signal related to said first output signal, said second output signal increasing and decreasing at a frequency determined by a time-constant circuit of said staircase generator in response to said first output signal;

a plurality of switches;

means responsive to selected ones of said switches for controlling the time-constant circuit of at least one of said generators wherein the relative frequency difference between said first and second signals changes from a first value to a second value so that said second output signal is synchronized with the frequency of said first signal when said difference is said first value, and wherein said second output signal varies randomly with respect to the frequency of said first signal when said difference is said second value;

means including a voltage-controlled-oscillator having an output coupled to an electroacoustic transducer for providing an audio output signal having a frequency which varies in accordance with the amplitude of a signal applied to the input of said oscillator; and, means coupled to said first and second output signals and including at least one other one of said switches for selectively providing an input signal to said oscillator which is indicative of the level of one or both of said first and second output signals.

11. The game device according to claim 10, wherein said second signal increases and decreases between first and second levels wherein the duration of each step is determined by said first signal and the level of each step is determined by said time-constant circuit of said staircase generator, and said coupling means including means responsive to said first output signal and further ones of said switches for selectively controlling said oscillator during predetermined portions of said first signal.

12. The game device according to claim 11 wherein said game device includes a housing wherein said switches and said electroacoustic transducer are mounted on at least one surface thereof.

* * * * *